(12) United States Patent
Takei (10) Patent No.: US 8,390,284 B2
(45) Date of Patent: Mar. 5, 2013

(54) MAGNETIC RESONANCE IMAGING APPARATUS, METHOD AND PROGRAM OF MAGNETIC RESONANCE IMAGING

(75) Inventor: Naoyuki Takei, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 492 days.

(21) Appl. No.: 12/713,665

(22) Filed: Feb. 26, 2010

(65) Prior Publication Data

US 2010/0219830 A1    Sep. 2, 2010

(30) Foreign Application Priority Data

Feb. 27, 2009  (JP) ................................. 2009-045719

(51) Int. Cl.
*G01V 3/00*   (2006.01)
(52) U.S. Cl. ...................... 324/306; 600/413
(58) Field of Classification Search .................. 324/306, 324/307, 309; 600/413, 419
See application file for complete search history.

(56) References Cited

U.S. PATENT DOCUMENTS

| 4,719,424 | A  | * | 1/1988 | Jimbo et al. | 324/309 |
| 5,323,110 | A  |   | 6/1994 | Fielden et al. | |
| 5,427,101 | A  |   | 6/1995 | Sachs et al. | |
| 7,417,427 | B2 | * | 8/2008 | Porter | 324/306 |
| 7,561,909 | B1 |   | 7/2009 | Pai et al. | |
| 7,945,305 | B2 | * | 5/2011 | Aggarwal et al. | 600/413 |
| 8,131,338 | B2 | * | 3/2012 | Kassai et al. | 600/410 |

FOREIGN PATENT DOCUMENTS

JP    2007-061545    3/2007

* cited by examiner

*Primary Examiner* — Louis Arana
(74) *Attorney, Agent, or Firm* — Armstrong Teasdale LLP (57) ABSTRACT

A magnetic resonance imaging apparatus includes a gradient coil, a transmission coil, an electrocardiographic signal detecting device detecting an electrocardiographic signal from a subject, a controlling device controlling the gradient coil and the transmission coil so that a pulse sequence including a preparation pulse and a data acquisition sequence for acquiring data from a subject utilizing a magnetic resonance phenomenon is repeatedly carried out, and a cardiac phase computing device computing the cardiac phase of the subject based on the electrocardiographic signal. The controlling device determines whether or not to re-acquire data once acquired from the subject based on the cardiac phase of the subject at an arbitrary time in a period during which the pulse sequence is carried out or the cardiac phase of the subject at a time after the pulse sequence is terminated.

20 Claims, 3 Drawing Sheets

FIG. 2

MAGNETIC RESONANCE IMAGING APPARATUS, METHOD AND PROGRAM OF MAGNETIC RESONANCE IMAGING

CROSS REFERENCE TO RELATED APPLICATIONS

This application claims the benefit of Japanese Patent Application No. 2009-045719 filed Feb. 27, 2009, which is hereby incorporated by reference in its entirety.

BACKGROUND OF THE INVENTION

Embodiments described herein relate to a magnetic resonance imaging apparatus that images a subject based on an electrocardiographic signal from the subject.

When a subject is imaged by non-contrast MRA (Magnetic Resonance Angiography), a flow void is prone to occur if data is acquired in a systole. Therefore, imaging is carried out in synchronization with heartbeats so that data can be acquired in a diastole.

There is known a technology for re-acquiring data if an artifact is produced when imaging is carried out in synchronization with heartbeats. (Refer to Japanese Unexamined Patent Publication No. 2007-061545.)

There are cases where after a preparation pulse, such as an inversion pulse, is transmitted, a predetermined wait time is provided before data is acquired. Data may be acquired in a systole if the cardiac cycle of the subject fluctuates in such a case and the image quality is degraded by a flow void.

BRIEF DESCRIPTION OF THE INVENTION

In one aspect, a magnetic resonance imaging apparatus includes a gradient coil; a transmission coil; an electrocardiographic signal detecting device that detects an electrocardiographic signal from a subject; a controlling device that controls the gradient coil and the transmission coil so that a pulse sequence including a preparation pulse and a data acquisition sequence for acquiring data from a subject utilizing a magnetic resonance phenomenon is repeatedly carried out; and a cardiac phase computing device that computes the cardiac phase of the subject based on the electrocardiographic signal.

The controlling device determines whether or not to re-acquire data once acquired from the subject based on the cardiac phase of the subject at an arbitrary time in a period during which the pulse sequence is carried out or the cardiac phase of the subject at a time after the pulse sequence is terminated.

In another aspect, a program is provided for controlling a magnetic resonance imaging apparatus so that a pulse sequence including a preparation pulse and a data acquisition sequence for acquiring data from a subject utilizing a magnetic resonance phenomenon is repeatedly carried out. Whether or not to re-acquire data once acquired from the subject is determined based on the cardiac phase of the subject at an arbitrary time in a period during which the pulse sequence is carried out or the cardiac phase of the subject at a time after the pulse sequence is terminated.

In some embodiments, whether or not to re-acquire data once acquired from a subject is determined based on the cardiac phase of the subject. Therefore, data can be re-acquired and thus a high-quality image can be obtained even though the cardiac cycle of the subject is disturbed and data cannot be acquired in a desired cardiac phase.

Further objects and advantages of the present invention will be apparent from the following description of the preferred embodiments of the invention as illustrated in the accompanying drawings.

DETAILED DESCRIPTION OF THE INVENTION

Hereafter, description will be given to embodiments of the invention; however, the invention is not limited to the embodiments described herein.

Figure 1:
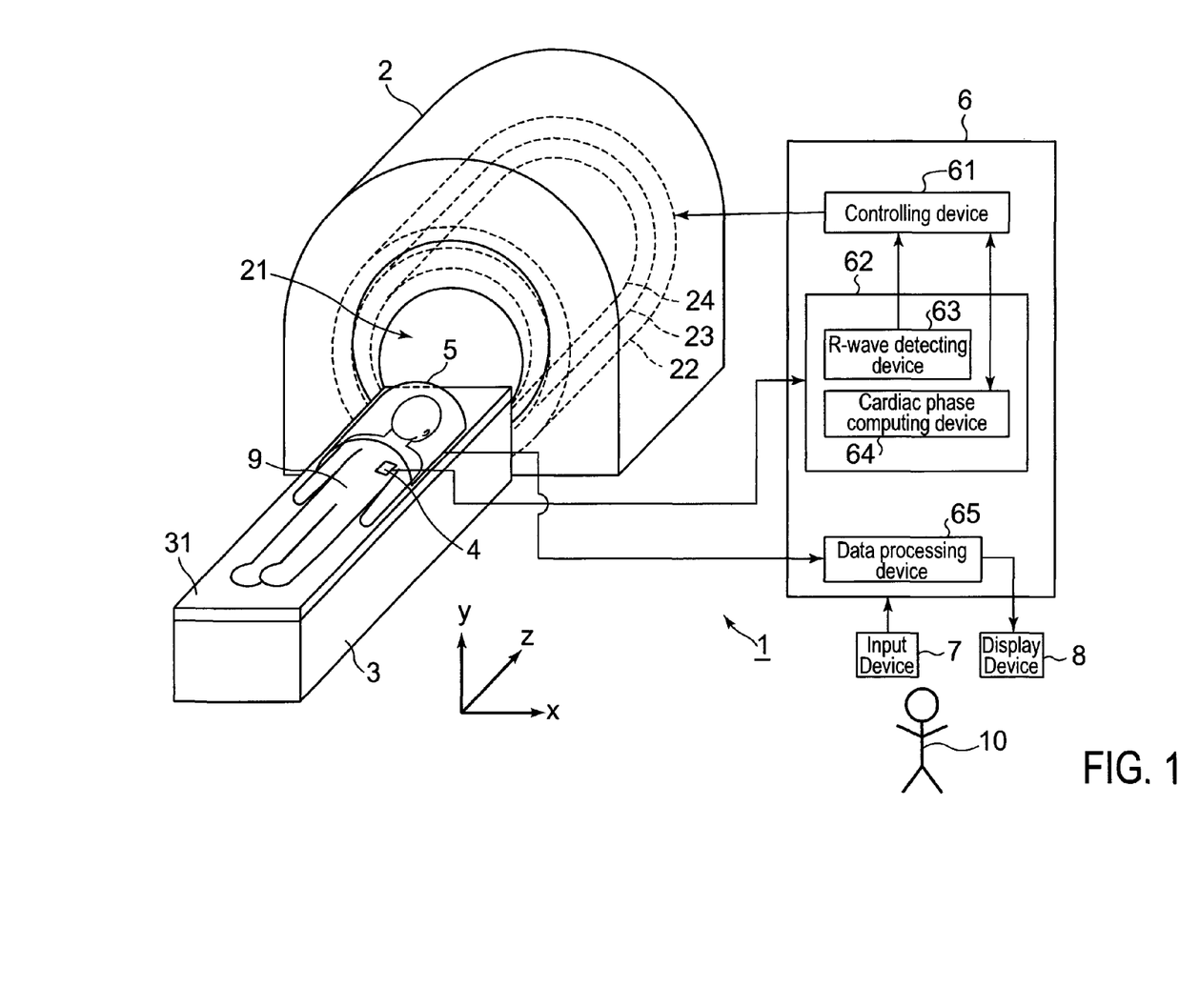
FIG. 1 is a schematic diagram of a magnetic resonance imaging apparatus 1 in an embodiment of the invention.

FIG. 1 is a schematic diagram of a magnetic resonance imaging apparatus 1 in an embodiment of the invention.

The magnetic resonance imaging apparatus (hereafter, referred to as MRI apparatus) 1 includes a coil assembly 2, a table 3, an electrode 4, a reception coil 5, a control unit 6, an input device 7, and a display device 8.

The coil assembly 2 includes a bore 21 for placing a subject 9 therein, a superconducting coil 22, a gradient coil 23, and a transmission coil 24. The superconducting coil 22 applies a static magnetic field B0; the gradient coil 23 applies a gradient pulse; and the transmission coil 24 sends an RF pulse.

The table 3 includes a cradle 31. The cradle 31 is so constructed that it is moved in the z direction and the −z direction. When the cradle 31 is moved in the z direction, the subject 9 is conveyed into the bore 21. When the cradle 31 is moved in the −z direction, the subject 9 conveyed into the bore 21 is carried out of the bore 21.

The electrode 4 is used to detect an electrocardiographic signal from the subject 9 and transmit the signal to an electrocardiographic signal analysis unit 62.

The reception coil 5 is installed from the breast to the head of a subject 9. An MR (Magnetic Resonance) signal received by the reception coil 5 is transmitted to the control unit 6.

The control unit 6 includes a controlling device 61, an electrocardiographic analysis unit 62, and a data processing device 65.

The controlling device 61 controls the gradient coil 23 and the transmission coil 24 so that a pulse sequence PS (Refer to FIG. 3) for data acquisition is repeatedly carried out. This control is carried out based on a command from the R-wave detecting device 63 described later and the result of computation by a cardiac phase computing device 64. Also the controlling device 61 determines whether or not to re-acquire data once acquired from the subject 9 based on the cardiac phase computed by the cardiac phase computing device 64.

The electrocardiographic analysis unit 62 includes the R-wave detecting device 63 and the cardiac phase computing device 64.

The R-wave detecting device 63 detects an R-wave from an electrocardiographic signal and transmits a command to carry out a pulse sequence PS to the controlling device 61 based on the detected R-wave.

The cardiac phase computing device 64 computes the cardiac phase of the subject 9 at a predetermined time in wait time W2 (Refer to FIG. 3) based on an electrocardiographic signal and transmits the result of computation to the controlling device 61.

The data processing device 65 processes data acquired from the subject 9 to reconstruct an image.

The input device 7 is operated by an operator 10 and transmits various commands and the like to the control unit 6.

The display device 8 displays an image and the like.

The subject 9 is imaged using the MRI apparatus 1 configured as mentioned above. The controlling device 61, electrocardiographic analysis unit 62, and data processing device 65 are implemented by installing programs for carrying out these functions. However, they may be implemented only by hardware without use of a program.

Figure 2:
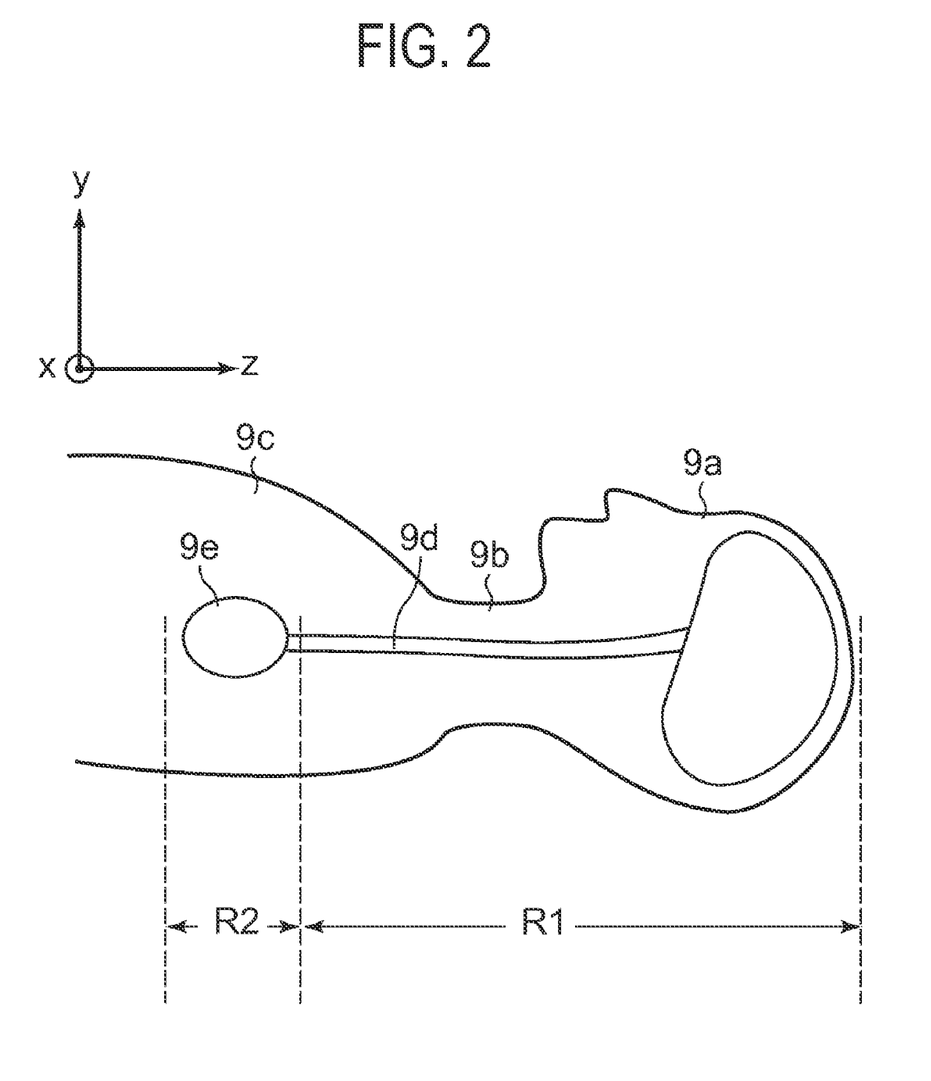
FIG. 2 is a drawing illustrating an example of an imaging region of a subject 9.

FIG. 2 is a drawing illustrating an example of an imaging region of a subject 9.

In this embodiment, the head 9a, neck 9b, and breast 9c of the subject 9 are imaged. The MRI apparatus 1 carries out a pulse sequence and represents arterial blood 9d utilizing the inflow effect of arterial blood 9d. The following takes place if data is acquired in a systole of the heart 9e when arterial blood 9d is represented utilizing the inflow effect of arterial blood 9d: a flow void makes it impossible to represent arterial blood 9d with high contrast. Therefore, it is desirable to acquire data in a diastole as much as possible. In this embodiment, consequently, a pulse sequence is carried out so that data can be re-acquired in a diastole if data is acquired in a systole. Hereafter, description will be given to how the MRI apparatus 1 in this embodiment carries out a pulse sequence.

Figures 3A, 3B, 3C:
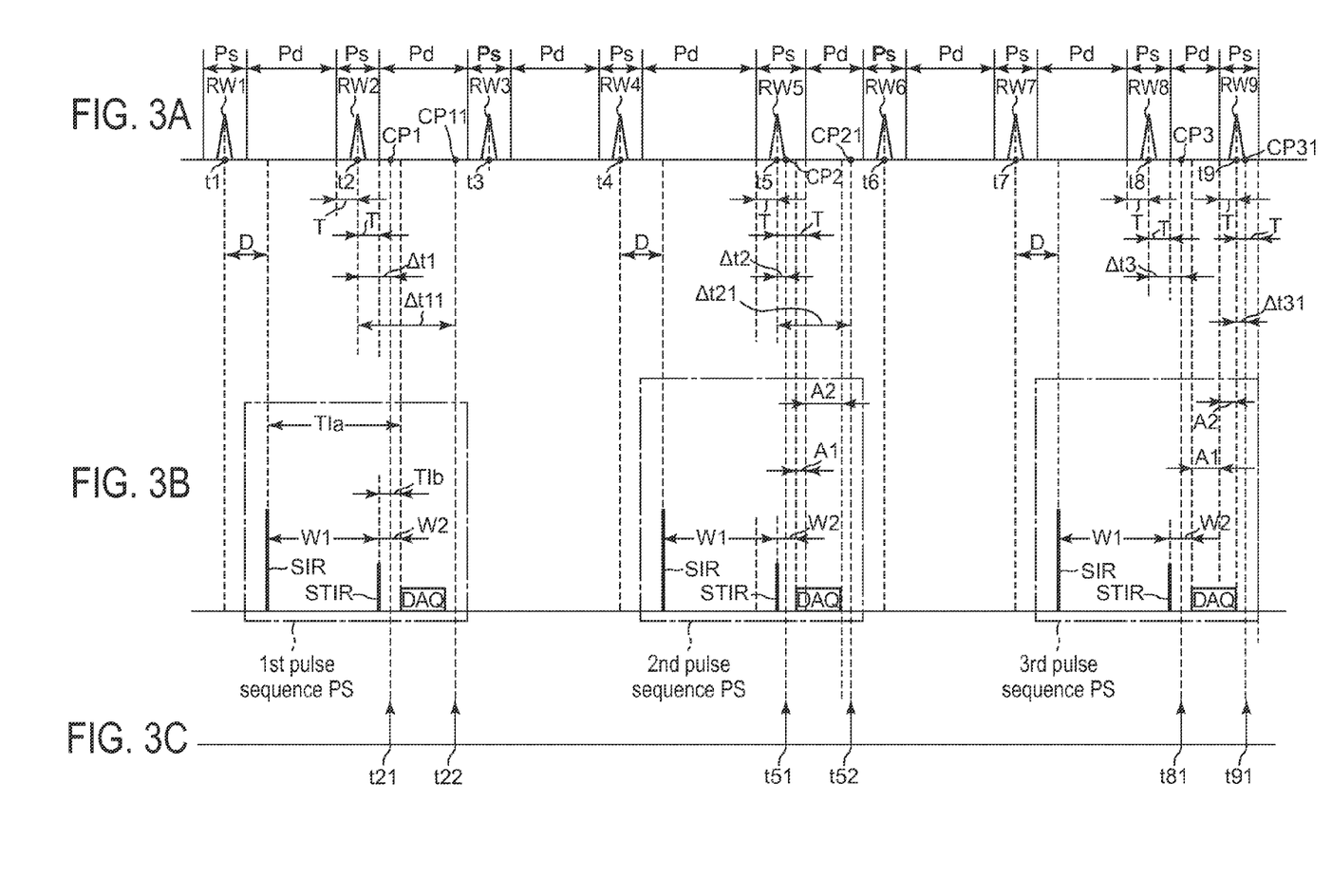
FIGS. 3A, 3B, and 3C illustrate how an MRI apparatus 1 in the embodiment carries out a pulse sequence.

FIGS. 3A-3C illustrate how the MRI apparatus 1 in this embodiment carries out a pulse sequence.

FIG. 3A is a chart indicating an electrocardiographic signal ECG; FIG. 3B is a chart indicating a pulse sequence; and FIG. 3C is a chart indicating timing with which a cardiac phase is computed.

In the electrocardiographic signal ECG (Refer to FIG. 3A) including from R-waves RW1 to RW9, systoles Ps and diastoles Pd are schematically indicated. In this embodiment, a period of ±T (sec) of the peak of each R-wave is defined as systole Ps and the remaining period is defined as diastole Pd. The predetermined value of T is, for example, 0.15 seconds. However, the systole Ps and the diastole Pd may be defined by any other method.

The pulse sequence PS (Refer to FIG. 3B) is an example of a pulse sequence in which arterial blood 9d is represented utilizing the inflow effect of arterial blood 9d. This pulse sequence PS is a pulse sequence in which it is possible not only to represent arterial blood 9d in an enhanced manner but also to suppress fat and other background tissue (for example, venous blood and muscle). Hereafter, brief description will be given to the pulse sequence PS. The pulse sequence PS includes selective inversion pulse SIR (Selective Inversion Recovery), fat suppression pulse STIR (Short Tau Inversion Recovery), and data acquisition sequence DAQ.

The selective inversion pulse SIR is a pulse that inverts the longitudinal magnetization of the tissue of a region R1 (Refer to FIG. 2) in an imaging region of the subject 9. The inversion time TIa of the selective inversion pulse SIR takes a value of, for example, 1200 msec to 1300 msec or so. The fat suppression pulse STIR is a pulse that inverts the longitudinal magnetization of the tissue of the entire imaging region (regions R1 and R2) of the subject 9. The inversion time TIb of the fat suppression pulse STIR takes a value of, for example, 175 msec to 185 msec or so. Between the selective inversion pulse SIR and the fat suppression pulse STIR, a wait time W1 (=TIa−TIb) is provided and between the fat suppression pulse STIR and the data acquisition sequence DAQ, a wait time W2 (=TIb) is provided. The following can be implemented by the selective inversion pulse SIR, wait time W1, fat suppression pulse STIR, and wait time W2: the longitudinal magnetization of not only fat but also other background tissue (venous blood and the like) can be brought closer to null point than the longitudinal magnetization of arterial blood 9d is. The data acquisition sequence DAQ is, for example, FSE (Fast Spin Echo) or SSFP (Steady State Free Precession).

The pulse sequence PS configured as mentioned above is repeatedly carried out in synchronization with the R-waves of the electrocardiographic signal ECG. In FIG. 3B, only three pulse sequences PS are indicated for the sake of convenience of explanation.

FIG. 3C indicates the timing with which the cardiac phase of the subject 9 is computed.

Hereafter, description will be given to a procedure for carrying out the pulse sequence PS with reference to FIGS. 3A-3C.

The R-wave detecting device 63 (Refer to FIG. 1) detects an R-wave based on an electrocardiographic signal ECG (Refer to FIG. 3A) detected at the electrode 4. When it detects the R-wave RW1, the R-wave detecting device 63 transmits a command to carry out the first pulse sequence PS to the controlling device 61 (Refer to FIG. 1). In response to this command, the controlling device 61 controls the gradient coil 23 and the transmission coil 24 so that the pulse sequence PS is carried out. First, when a delay time D has passed after the R-wave RW1, the selective inversion pulse SIR is transmitted. When the wait time W1 (=TIa−TIb) has passed after the transmission of the selective inversion pulse SIR, the fat suppression pulse STIR is transmitted. When the wait time W2 (=TIb) has passed after the transmission of the fat suppression pulse STIR, the data acquisition sequence DAQ is started to acquire data from the subject 9. When the data acquisition sequence DAQ is terminated, the first pulse sequence PS is terminated.

At time t21 (Refer to FIG. 3C) during the wait time W2, the controlling device 61 transmits a cardiac phase computation command to compute the cardiac phase of the subject 9 to the cardiac phase computing device 64. In response to this cardiac phase computation command, the cardiac phase computing device 64 computes the cardiac phase CP1 of the subject 9 at time t21. In this embodiment, the cardiac phase computing device 64 computes the time difference Δt1 between time t21 and time t2 of the R-wave RW2 immediately before time t21 and computes the cardiac phase CP1 of the subject 9 at time t21 based on the value of Δt1. (However, it may be computed by any other method.) The cardiac phase computing device 64 transmits the computed cardiac phase CP1 to the computing device 61. The controlling device 61 determines whether the cardiac phase CP1 belongs to a systole Ps or a diastole Pd. In this embodiment, this determination is carried out as follows: when Δt1 is equal to or lower than the predetermined value T, the cardiac phase CP1 is determined to belong to a systole Ps; and when Δt1 is higher than the predetermined value T, the cardiac phase CP1 is determined to belong to a diastole Pd. (However, whether a cardiac phase belongs to a systole Ps or a diastole Pd may be determined by any other method.) As indicated by FIG. 3A, Δt1 is higher than the predetermined value T. Therefore, the controlling device 61 determines that the cardiac phase CP1 belongs to a diastole Pd. Based on the result of this determination, the controlling device 61 determines whether or not to re-acquire data once acquired by the first pulse sequence PS. That the cardiac phase CP1 of the subject 9 belongs to a diastole Pd means that there is a high possibility that a good part of the data acquisition sequence DAQ immediately after time t21 is carried out during the diastole Pd. That is, it means that arterial blood 9d can be represented with sufficient contrast.

Therefore, the controlling device 61 determines that it is unnecessary to re-acquire data once acquired by the first pulse sequence PS.

After the first pulse sequence PS is terminated, the R-wave detecting device 63 detects two R-waves RW3 and RW4. When it detects the second R-wave RW4, the R-wave detecting device 63 transmits a command to carry out the second pulse sequence PS to the controlling device 61. In response to this command, the controlling device 61 controls the gradient coil 23 and the transmission coil 24 so that the second pulse sequence PS is carried out. To carry out the second pulse sequence PS, first, the selective inversion pulse SIR is transmitted when the delay time D has passed after the R-wave RW4. When the wait time W1 has passed after the transmission of the selective inversion pulse SIR, the fat suppression pulse STIR is transmitted. When the wait time W2 has passed after the transmission of the fat suppression pulse STIR, the data acquisition sequence DAQ is started and data is acquired from the subject 9. When the data acquisition sequence DAQ is terminated, the second pulse sequence PS is terminated.

At time t51 (Refer to FIG. 3C) during the wait time W2, the controlling device 61 transmits a cardiac phase computation command to compute the cardiac phase of the subject 9 to the cardiac phase computing device 64. In response to this cardiac phase computation command, the cardiac phase computing device 64 computes the cardiac phase CP2 of the subject 9 at time t51. In this embodiment, the cardiac phase computing device 64 computes the time difference Δt2 between time t51 and time t5 of the R-wave RW5 immediately before time t51 and computes the cardiac phase CP2 of the subject 9 at time t51 based on the value of Δt2. (However, it may be computed by any other method.) The cardiac phase computing device 64 transmits the computed cardiac phase CP2 to the controlling device 61. The controlling device 61 determines whether the cardiac phase CP2 belongs to a systole Ps or a diastole Pd. In this embodiment, this determination is carried out as follows: when Δt2 is equal to or lower than the predetermined value T, the cardiac phase CP2 is determined to belong to a systole P5; and when Δt2 is higher than the predetermined value T, the cardiac phase CP2 is determined to belong to a diastole Pd. (However, whether a cardiac phase belongs to a systole Ps or a diastole Pd may be determined by any other method.) As indicated by FIG. 3A, Δt2 is lower than the predetermined value T. Therefore, the controlling device 61 determines that the cardiac phase CP2 belongs to a systole Ps. Based on the result of this determination, the controlling device 61 determines whether or not to re-acquire data once acquired by the second pulse sequence PS. That the cardiac phase CP2 belongs to a systole Ps means that there is a high possibility that at least part of the data acquisition sequence DAQ immediately after time t51 is carried out during the systole Ps. This means that there is a possibility that arterial blood 9d cannot be represented in an enhanced manner due to a flow void. Therefore, the controlling device 61 determines that it is required to re-acquire data once acquired by the second pulse sequence PS. When the controlling device 61 determines that it is required to re-acquire data, the MRI apparatus 1 operates as follows:

After the termination of the second pulse sequence PS, the R-wave detecting device 63 detects two R-waves RW6 and RW7. When it detects the R-wave RW7, the R-wave detecting device 63 transmits a command to carry out the third pulse sequence PS to the controlling device 61. In response to this command, the controlling device 61 controls the gradient coil 23 and the transmission coil 24 so that the third pulse sequence PS is carried out. However, the controlling device 61 has determined that it is required to re-acquire data once acquired by the second pulse sequence PS. Therefore, the third pulse sequence PS is carried out so that data once acquired by the second pulse sequence PS is re-acquired under the control of the controlling device 61.

Further, the controlling device 61 transmits a cardiac phase computation command to compute the cardiac phase of the subject 9 to the cardiac phase computing device 64 at time t81 (Refer to FIG. 3C) during the wait time W2. In response to this cardiac phase computation command, the cardiac phase computing device 64 computes the cardiac phase CP3 of the subject 9 at time t81. In this embodiment, the cardiac phase computing device 64 computes the time difference Δt3 between time t81 and time t8 of the R-wave RW8 immediately before time t81 and computes the cardiac phase CP3 of the subject 9 at time t81 based on the value of Δt3. (However, it may be computed by any other method.) The cardiac phase computing device 64 transmits the computed cardiac phase CP3 to the controlling device 61. The controlling device 61 determines whether the cardiac phase CP3 belongs to a systole Ps or a diastole Pd. In this embodiment, this determination is carried out as follows: when Δt3 is equal to or lower than the predetermined value T, the cardiac phase CP3 is determined to belong to a systole Ps; and when Δt3 is higher than the predetermined value T, the cardiac phase CP3 is determined to belong to a diastole Pd. (However, whether a cardiac phase belongs to a systole Ps or a diastole Pd may be determined by any other method.) As indicated by FIG. 3A, Δt3 is higher than the predetermined value T, the controlling device 61 determines that the cardiac phase CP3 belongs to a diastole Pd. Based on the result of this determination, the controlling device 61 determines whether or not to re-acquire data once acquired by the third pulse sequence PS. That the cardiac phase CP3 of the subject 9 belongs to a diastole Pd means that there is a high possibility that a good part of the data acquisition sequence DAQ immediately after time t81 is carried out during the diastole Pd. This means that arterial blood 9d can be represented with sufficient contrast. Therefore, the controlling device 61 determines that it is unnecessary to re-acquire data once acquired by the third pulse sequence PS.

Subsequently, the following processing is similarly carried out: each pulse sequence PS is repeatedly carried out and, immediately before the data acquisition sequence DAQ is started, it is determined whether or not the cardiac phase of the subject 9 belongs to a diastole Pd.

In this embodiment, whether or not the cardiac phase of the subject 9 belongs to a diastole Pd is determined immediately before the data acquisition sequence DAQ is started. When it is determined that it does not belong to a diastole Pd, there is a high possibility that at least part of the data acquisition sequence DAQ is carried out during a systole Ps. Consequently, data is re-acquired by the next pulse sequence PS. Even though the cardiac cycle is disturbed, therefore, a high-quality image in which reduction in the contrast of arterial blood 9d due to a flow void is suppressed can be obtained.

In the description of this embodiment, a case where it is determined in the third pulse sequence PS that the cardiac phase CP3 belongs to a diastole Pd has been taken as an example. If it is determined that the cardiac phase CP3 does not belong to a diastole Pd, however, data once acquired by the third pulse sequence PS is re-acquired by the fourth pulse sequence PS. Subsequently, data once acquired by the second pulse sequence PS is similarly re-acquired until it is determined that the cardiac phase belongs to a diastole Pd. Therefore, an image with a flow void reduced can be obtained without fail. However, the imaging time is lengthened with increase in the number of times of data re-acquisition. To cope with this, the following measure can be taken: an upper limit value of the number of times of data re-acquisition is preset and, when this upper limit value is exceeded, the pulse sequence PS for re-acquiring data is not carried out.

When it is determined to re-acquire data, in this embodiment, data is re-acquired in the next pulse sequence PS. However, data re-acquisition need not be carried out in the next pulse sequence PS and may be carried out any time in a period during which a scan is carried out.

In the above description, the cardiac phase of the subject 9 immediately before the data acquisition sequence DAQ is computed. Instead, the cardiac phase of the subject 9 immediately after the data acquisition sequence DAQ may be computed. Hereafter, description will be given to how the pulse sequence SP is carried out when the cardiac phase of the subject 9 immediately after the data acquisition sequence DAQ is computed with reference to FIGS. 3A-3C.

When the cardiac phase of the subject 9 immediately after the data acquisition sequence DAQ, the cardiac phase computing device 64 computes the cardiac phases of the subject 9 at time t22, time t51, and time t91. (Refer to FIG. 3C.)

In the first pulse sequence PS, first, the cardiac phase computing device 64 computes the cardiac phase CP11 (Refer to FIG. 3A) of the subject 9 at time t22 immediately after the data acquisition sequence DAQ. The cardiac phase CP11 can be computed by, for example, the following procedure: the time difference $\Delta t11$ between time t22 and time t2 of the R-wave RW2 immediately before time t22 is computed and computation is carried out based on the value of $\Delta t11$. The cardiac phase computing device 64 transmits the computed cardiac phase CP11 to the controlling device 61. The controlling device 61 determines whether the cardiac phase CP11 belongs to a systole Ps or a diastole Pd. This determination can be made based on, for example, the inequality relation between $\Delta t11$ and the predetermined value T. For example, when $\Delta t11$ is lower than the predetermined value T, the cardiac phase CP11 is determined to belong to a systole Ps; and when $\Delta t11$ is higher than the predetermined value T, the cardiac phase CP11 is determined to belong to a diastole Pd. As indicated by FIG. 3A, $\Delta t11$ is higher than the predetermined value T and thus the controlling device 61 determines that the cardiac phase CP11 belongs to a diastole Pd. Therefore, the controlling device 61 determines that it is unnecessary to re-acquire data once acquired by the first pulse sequence PS.

After the termination of the first pulse sequence PS, the R-wave detecting device 63 detects two R-waves RW3 and RW4. When it detects the R-wave RW4, the R-wave detecting device 63 transmits a command to carry out the second pulse sequence PS to the controlling device 61. In response to this command, the controlling device 61 controls the gradient coil 23 and the transmission coil 24 so that the second pulse sequence PS is carried out.

In the second pulse sequence PS, subsequently, the cardiac phase computing device 64 computes the cardiac phase CP21 (Refer to FIG. 3A) of the subject 9 at time t52 immediately after the data acquisition sequence DAQ. The cardiac phase CP21 can be computed by, for example, the following procedure: the time difference $\Delta t21$ between time t52 and time t2 of the R-wave RW5 immediately before time t52 is computed and computation is carried out based on the value of $\Delta t21$. The cardiac phase computing device 64 transmits the computed cardiac phase CP21 to the controlling device 61. The controlling device 61 determines whether the cardiac phase CP21 belongs to a systole Ps or a diastole Pd. This determination can be made based on, for example, the inequality relation between $\Delta t21$ and the predetermined value T. For example, when $\Delta t21$ is lower than the predetermined value T, the cardiac phase CP21 is determined to belong to a systole Ps; and when $\Delta t21$ is higher than the predetermined value T, the cardiac phase CP21 is determined to belong to a diastole Pd. As indicated by FIG. 3A, $\Delta t21$ is higher than the predetermined value T and thus the controlling device 61 determines that the cardiac phase CP21 belongs to a diastole Pd. Therefore, the controlling device 61 determines that it is unnecessary to re-acquire data once acquired by the second pulse sequence PS.

After the termination of the second pulse sequence PS, the R-wave detecting device 63 detects two R-waves RW6 and RW7. When it detects the R-wave RW7, the R-wave detecting device 63 transmits a command to carry out the third pulse sequence PS to the controlling device 61. In response to this command, the controlling device 61 controls the gradient coil 23 and the transmission coil 24 so that the pulse sequence PS is carried out.

In the third pulse sequence PS, subsequently, the cardiac phase computing device 64 computes the cardiac phase CP31 (Refer to FIG. 3A) of the subject 9 at time t91 immediately after the data acquisition sequence DAQ. The cardiac phase CP31 can be computed by, for example, the following procedure: the time difference $\Delta t31$ between time t91 and time t9 of the R-wave RW9 immediately before time t91 is computed and computation is carried out based on the value of $\Delta t31$. The cardiac phase computing device 64 transmits the computed cardiac phase CP31 to the controlling device 61. The controlling device 61 determines whether the cardiac phase CP31 belongs to a systole Ps or a diastole Pd. This determination can be made based on, for example, the inequality relation between $\Delta t31$ and the predetermined value T. For example, when $\Delta t31$ is lower than the predetermined value T, the cardiac phase CP31 is determined to belong to a systole Ps; and when $\Delta t31$ is higher than the predetermined value T, the cardiac phase CP31 is determined to belong to a diastole Pd. As indicated by FIG. 3A, $\Delta t31$ is lower than the predetermined value T and thus the controlling device 61 determines that the cardiac phase CP31 belongs to a systole Ps. Therefore, the controlling device 61 determines to re-acquire data once acquired by the third pulse sequence PS. When the controlling device 61 determines to re-acquire data, data is re-acquired in the fourth pulse sequence PS (not shown).

Subsequently, the following processing is similarly carried out: each pulse sequence PS is repeatedly carried out and, immediately after the data acquisition sequence DAQ is terminated, it is determined whether or not the cardiac phase of the subject 9 belongs to a diastole Pd.

As mentioned above, it may be determined immediately after the data acquisition sequence DAQ whether or not the cardiac phase of the subject 9 belongs to a diastole Pd.

The result of determination may differ depending on when it is determined whether or not the cardiac phase of the subject 9 belongs to a diastole Pd. That is, it may differ depending on whether the determination is carried out immediately before the data acquisition sequence DAQ is started or immediately after the data acquisition sequence DAQ is terminated. In the second pulse sequence PS, for example, the cardiac phase of the subject 9 transitions from systole Ps to diastole Pd in the process of the execution of the data acquisition sequence DAQ. Therefore, when the cardiac phase is determined at time t51 immediately before the data acquisition sequence DAQ is started, the result of the determination is systole Ps. Meanwhile, when the cardiac phase is determined at time t52 immediately after the data acquisition sequence DAQ is terminated, the result of the determination is diastole Pd. Thus the result of cardiac phase determination differs depending on when the determination of the cardiac phase is carried out. Since whether or not to re-acquire data is determined according to the result of determination, it is important whether the cardiac phase is determined immediately before the data acquisition sequence DAQ is started or immediately after it is terminated. Hereafter, description will be given to examples of the following cases: cases where it is desirable to determine the cardiac phase immediately before the data acquisition sequence DAQ is started; and cases where it is desirable to determine the cardiac phase immediately after the sequence is terminated.

Data filling a high-frequency region of the k-space has less influence on the contrast of an image than data filling a low-frequency region does. Therefore, when data acquired during a systole Ps is data filling a high-frequency region of the k-space, the contrast of an image is not reduced too far even though this data is used to reconstruct the image. Meanwhile, when data acquired during a systole Ps is data filling a low-frequency region of the k-space, the contrast of an image may be significantly reduced if this data is used to reconstruct the image. Therefore, when data filling a low-frequency region of the k-space is acquired during a systole Ps, it is desirable to ensure that data re-acquisition is carried out. Consequently, when data filling a low-frequency region of the k-space is acquired in the beginning of the data acquisition sequence DAQ, it is desirable that the cardiac phase should be determined immediately before the data acquisition sequence DAQ is started. In case of the second pulse sequence PS, for example, the initial part A1 of the data acquisition sequence DAQ is carried out during a systole Ps. Therefore, when data filling a low-frequency region of the k-space is acquired in the beginning of the data acquisition sequence DAQ, the following takes place: in the second pulse sequence PS, data filling a low-frequency region of the k-space is acquired during a systole Ps. However, when the cardiac phase is determined immediately before the data acquisition sequence DAQ is started, the cardiac phase of the subject 9 is determined to belong to a systole Ps. As a result, data is re-acquired in the third pulse sequence PS. Even though the cardiac cycle is disturbed, therefore, a high-quality image in which reduction in the contrast of arterial blood 9d due to a flow void is suppressed can be obtained.

Meanwhile, when data filling a low-frequency region of the k-space is acquired in the end of the data acquisition sequence DAQ, it is desirable that the cardiac phase should be determined immediately after the data acquisition sequence DAQ is terminated. In case of the third pulse sequence PS, for example, the last part A2 of the data acquisition sequence DAQ is carried out during a systole Ps. Therefore, when data filling a low-frequency region of the k-space is acquired in the end of the data acquisition sequence DAQ, the following takes place: in the third pulse sequence PS, data filling a low-frequency region of the k-space is acquired during a systole Ps. However, when the cardiac phase is determined immediately after the data acquisition sequence DAQ is terminated, the cardiac phase of the subject 9 is determined to belong to a systole Ps. As a result, data is re-acquired in the fourth pulse sequence PS (not shown). Even though the cardiac cycle is disturbed, therefore, a high-quality image in which reduction in the contrast of arterial blood 9d due to a flow void is suppressed can be obtained.

In this embodiment, the pulse sequence PS is used; however, any other pulse sequence may be used. For example, a pulse sequence having a fat suppression pulse (for example, Spectral IR) other than the fat suppression pulse STIR may be used.

In this embodiment, the pulse sequence PS has two preparation pulses SIR and STIR before the data acquisition sequence. However, the invention is also applicable to cases where the pulse sequence has only one preparation pulse before the data acquisition sequence and cases where it has three or more preparation pulses before the data acquisition sequence.

In this embodiment, the cardiac phase of the subject 9 is computed immediately before the data acquisition sequence is started or immediately after the data acquisition sequence is terminated. Instead, the cardiac phase of the subject 9 may be computed both at a time immediately before the data acquisition sequence is started and at a time immediately after the data acquisition sequence is terminated. By computing the cardiac phase at both times, the determination of whether or not to re-acquire data can be more accurately carried out. The cardiac phase of the subject 9 in a period during which the data acquisition sequence DAQ is carried out may be computed.

In this embodiment, the head 9a, neck 9b, and breast 9c of the subject 9 are imaged. However, the invention is applicable regardless of the location of the imaging region.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging apparatus comprising:
a gradient coil;
a transmission coil;
an electrocardiographic signal detecting device configured to detect an electrocardiographic signal from a subject;
a controlling device configured to cause the gradient coil and the transmission coil to repeatedly perform a first pulse sequence including a preparation pulse and a data acquisition sequence for acquiring data from the subject utilizing a magnetic resonance phenomenon; and
a cardiac phase computing device configured to compute a cardiac phase of the subject based on the electrocardiographic signal,
wherein the controlling device is further configured to determine whether or not to re-acquire the data from the subject based on the cardiac phase of the subject at an arbitrary time in a period during which the first pulse sequence is carried out or the cardiac phase of the subject at a time after the first pulse sequence is terminated.

2. The magnetic resonance imaging apparatus according to claim 1, wherein when the controlling device determines to re-acquire the data, the controlling device is configured to cause the gradient coil and the transmission coil to perform a second pulse sequence for re-acquiring the data.

3. The magnetic resonance imaging apparatus according to claim 1,
wherein the controlling device is configured to transmit a cardiac phase computation command to compute the cardiac phase of the subject to the cardiac phase computing device while the first pulse sequence is being carried out or after the first pulse sequence is terminated, and
wherein in response to the cardiac phase computation command, the cardiac phase computing device is configured to compute the cardiac phase of the subject at the arbitrary time in the period during which the first pulse sequence is carried out or the cardiac phase of the subject at the time after the first pulse sequence is terminated.

4. The magnetic resonance imaging apparatus according to claim 2,
wherein the controlling device is configured to transmit a cardiac phase computation command to compute the cardiac phase of the subject to the cardiac phase computing device while the first pulse sequence is being carried out or after the first pulse sequence is terminated, and
wherein in response to the cardiac phase computation command, the cardiac phase computing device is configured to compute the cardiac phase of the subject at the arbitrary time in the period during which the first pulse sequence is carried out or the cardiac phase of the subject at the time after the first pulse sequence is terminated.

5. The magnetic resonance imaging apparatus according to claim 1,
wherein the controlling device is configured to transmit a cardiac phase computation command to compute the cardiac phase of the subject to the cardiac phase computing device during a period from when the preparation pulse is transmitted to when the data acquisition sequence is started, and
wherein in response to the cardiac phase computation command, the cardiac phase computing device is configured to compute the cardiac phase of the subject at an arbitrary time in a period from when the preparation pulse is transmitted to when the data acquisition sequence is started.

6. The magnetic resonance imaging apparatus according to claim 2,
wherein the controlling device is configured to transmit a cardiac phase computation command to compute the cardiac phase of the subject to the cardiac phase computing device during a period from when the preparation pulse is transmitted to when the data acquisition sequence is started, and
wherein in response to the cardiac phase computation command, the cardiac phase computing device is configured to compute the cardiac phase of the subject at an arbitrary time in a period from when the preparation pulse is transmitted to when the data acquisition sequence is started.

7. The magnetic resonance imaging apparatus according to claim 3,
wherein the controlling device is configured to transmit a cardiac phase computation command to compute the cardiac phase of the subject to the cardiac phase computing device during a period from when the preparation pulse is transmitted to when the data acquisition sequence is started, and
wherein in response to the cardiac phase computation command, the cardiac phase computing device is configured to compute the cardiac phase of the subject at an arbitrary time in a period from when the preparation pulse is transmitted to when the data acquisition sequence is started.

8. The magnetic resonance imaging apparatus according to claim 5,
wherein the pulse sequence includes a plurality of preparation pulses,
wherein the controlling device is configured to transmit the cardiac phase computation command to compute the cardiac phase of the subject to the cardiac phase computing device during a period from when the last preparation pulse is transmitted to when the data acquisition sequence is started, and
wherein in response to the cardiac phase computation command, the cardiac phase computing device is configured to compute the cardiac phase of the subject at an arbitrary time in a period from when the last preparation pulse is transmitted to when the data acquisition sequence is started.

9. The magnetic resonance imaging apparatus according to claim 6,
wherein the pulse sequence includes a plurality of preparation pulses,
wherein the controlling device is configured to transmit the cardiac phase computation command to compute the cardiac phase of the subject to the cardiac phase computing device during a period from when the last preparation pulse is transmitted to when the data acquisition sequence is started, and
wherein in response to the cardiac phase computation command, the cardiac phase computing device is configured to compute the cardiac phase of the subject at an arbitrary time in a period from when the last preparation pulse is transmitted to when the data acquisition sequence is started.

10. The magnetic resonance imaging apparatus according to claim 7,
wherein the pulse sequence includes a plurality of preparation pulses,
wherein the controlling device is configured to transmit the cardiac phase computation command to compute the cardiac phase of the subject to the cardiac phase computing device during a period from when the last preparation pulse is transmitted to when the data acquisition sequence is started, and
wherein in response to the cardiac phase computation command, the cardiac phase computing device is configured to compute the cardiac phase of the subject at an arbitrary time in a period from when the last preparation pulse is transmitted to when the data acquisition sequence is started.

11. The magnetic resonance imaging apparatus according to claim 1,
wherein the controlling device is configured to transmit a cardiac phase computation command to compute the cardiac phase of the subject to the cardiac phase computing device during a period from when the execution of the first pulse sequence is terminated to when the execution of a second pulse sequence is started, and
wherein in response to the cardiac phase computation command, the cardiac phase computing device is configured to compute the cardiac phase of the subject at an arbitrary time in a period from when the execution of the first pulse sequence is terminated to when the execution of the second pulse sequence is started.

12. The magnetic resonance imaging apparatus according to claim 2,
wherein the controlling device is configured to transmit a cardiac phase computation command to compute the cardiac phase of the subject to the cardiac phase computing device during a period from when the execution of the first pulse sequence is terminated to when the execution of the second pulse sequence is started, and
wherein in response to the cardiac phase computation command, the cardiac phase computing device is configured to compute the cardiac phase of the subject at an arbitrary time in a period from when the execution of the first pulse sequence is terminated to when the execution of the second pulse sequence is started.

13. The magnetic resonance imaging apparatus according to claim 1, wherein the controlling device is configured to determine whether or not to re-acquire the data from the subject based on the cardiac phase of the subject at the arbitrary time in the period during which the first pulse sequence is carried out and the cardiac phase of the subject at a time after the first pulse sequence is terminated.

14. The magnetic resonance imaging apparatus according to claim 2, wherein the controlling device is configured to determine whether or not to re-acquire the data from the subject based on the cardiac phase of the subject at the arbitrary time in the period during which the first pulse sequence is carried out and the cardiac phase of the subject at a time after the first pulse sequence is terminated.

15. The magnetic resonance imaging apparatus according to claim 3, wherein the controlling device is configured to determine whether or not to re-acquire the data from the subject based on the cardiac phase of the subject at the arbitrary time in the period during which the first pulse sequence is carried out and the cardiac phase of the subject at a time after the first pulse sequence is terminated.

16. The magnetic resonance imaging apparatus according to claim 4, wherein the controlling device is configured to determine whether or not to re-acquire the data from the subject based on the cardiac phase of the subject at the arbitrary time in the period during which the first pulse sequence is carried out and the cardiac phase of the subject at a time after the first pulse sequence is terminated.

17. The magnetic resonance imaging apparatus according to claim 1, wherein the preparation pulse is a fat suppression pulse.

18. The magnetic resonance imaging apparatus according to claim 1, wherein the controlling device is configured to determine whether the cardiac phase belongs to a diastole or a systole and, when it is determined that the cardiac phase belongs to the systole, to determine whether to re-acquire the data from the subject.

19. A method of magnetic resonance imaging comprising:
repeatedly performing a pulse sequence including a preparation pulse and a data acquisition sequence;
acquiring data from a subject utilizing a magnetic resonance phenomenon in response to the pulse sequence; and
determining whether or not to re-acquire the data from the subject based on a cardiac phase of the subject at an arbitrary time in a period during which the pulse sequence is carried out or the cardiac phase of the subject at a time after the pulse sequence is terminated.

20. A non-transitory computer-readable storage medium having computer-executable instructions embodied thereon for use in controlling a magnetic resonance imaging (MRI) apparatus, the apparatus including a memory device and a processor, wherein when executed by the processor, the computer-executable instructions cause the processor to:
repeatedly perform a pulse sequence including a preparation pulse and a data acquisition sequence;
acquire data from a subject utilizing a magnetic resonance phenomenon; and
determine whether or not to re-acquire the data from the subject is determined based on a cardiac phase of the subject at an arbitrary time in a period during which the pulse sequence is carried out or the cardiac phase of the subject at a time after the pulse sequence is terminated.

* * * * *